United States Patent [19]
Masuda et al.

[11] Patent Number: 6,121,645
[45] Date of Patent: *Sep. 19, 2000

[54] NOISE-REDUCING CIRCUIT

[76] Inventors: Hirohisa Masuda; Masahisa Tashiro, both of c/o OKI Electric Industry Co., Ltd., 7-12, Toranomon 1-chome, Minato-ku, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/881,500

[22] Filed: Jun. 24, 1997

[30] Foreign Application Priority Data

Jun. 26, 1996 [JP] Japan .................................. 8-165469

[51] Int. Cl.[7] .............................................. H01L 27/105
[52] U.S. Cl. ........................................ 257/207; 257/532
[58] Field of Search ........................... 257/202–211, 532, 257/668

[56] References Cited

U.S. PATENT DOCUMENTS

| | | | |
|---|---|---|---|
| 4,626,881 | 12/1986 | Kishi et al. ............................... | 257/532 |
| 4,654,689 | 3/1987 | Fujii ....................................... | 257/532 |
| 4,870,300 | 9/1989 | Nakaya et al. ........................... | 257/206 |
| 5,055,905 | 10/1991 | Anmo ..................................... | 257/532 |
| 5,148,263 | 9/1992 | Hamai ..................................... | 257/207 |
| 5,307,309 | 4/1994 | Protigal et al. ........................... | 365/63 |
| 5,343,058 | 8/1994 | Shiffer, II ............................... | 257/204 |
| 5,401,989 | 3/1995 | Kikuchi ................................... | 257/532 |
| 5,414,291 | 5/1995 | Miwa et al. ............................. | 257/532 |
| 5,420,449 | 5/1995 | Oji .......................................... | 257/532 |
| 5,452,245 | 9/1995 | Hickman et al. ........................ | 257/206 |
| 5,608,258 | 3/1997 | Rajkanan et al. ........................ | 257/532 |

FOREIGN PATENT DOCUMENTS

| | | | |
|---|---|---|---|
| 0644594 A1 | 3/1995 | European Pat. Off. . | |
| 63-120446 | 5/1988 | Japan ..................................... | 257/532 |
| 63143843 | 6/1988 | Japan . | |
| 1-278749 | 11/1989 | Japan ..................................... | 257/532 |
| 03097245 | 4/1991 | Japan . | |
| 4-196583 | 7/1992 | Japan ..................................... | 257/532 |
| 5-283611 | 10/1993 | Japan ..................................... | 257/532 |
| 6-177267 | 6/1994 | Japan ..................................... | 257/207 |
| 07106521 | 4/1995 | Japan . | |

*Primary Examiner*—David Hardy
*Attorney, Agent, or Firm*—Venable

[57] ABSTRACT

An integrated circuit has a capacitor consisting of an active area originally employable for power supply/GND, a gate insulator layer and a conductive polycrystalline silicon layer produced on a part of the active area originally employable for power supply/GND. The capacitor is employed to exclude external noises from the integrated circuit and is produced on an area which is unemployed in the prior art.

10 Claims, 8 Drawing Sheets

NOISE-REDUCING CIRCUIT

This invention relates to an improvement applicable to an integrated circuit (IC). More specifically, this invention relates to an improvement developed for enabling a semicustom integrated circuit, particularly a semicustom large scale integration (LSI) circuit, to exclude external noise particularly noise originated from a power supply, from the semicustom integrated circuit.

BACKGROUND OF THE INVENTION

An IC or LSI available in the prior art usually has a circuit having a capacitor connected in series with ground, the circuit being arranged between the core domain and the input/output (I/O) domain of the IC or LSI. The function of the circuit is to prevent external noise from entering the major circuits of the IC or LSI and to expel noise toward the outside of the IC or LSI.

A semicustom IC or LSI has a plurality of unit cells arranged in a regular lattice pattern or in a matrix pattern. FIG. 1 illustrates the plan view of the unit cell of a semicustom LSI. In the drawing, the numeral 1 shows a unit cell having a P channel transistor 2 and an N channel transistor 11 therein. The P channel transistor 2 has an $N^-$ doped semiconductor layer 3 whose potential is selected to be identical to the substrate potential. The numeral 4 shows an $N^+$ active area located in the $N^-$ doped semiconductor layer 3. The numeral 5 shows a P semiconductor substrate, the numeral 6 shows an N well produced in the P semiconductor substrate, the numeral 7 shows gates, the numeral 8 shows a $P^-$ doped semiconductor layer, the numeral 9 shows a $P^+$ active area located in the $P^-$ doped semiconductor layer 8, and the numeral 10 shows a VDD line.

Incidentally, the N channel transistor 11 has a $P^-$ doped semiconductor layer 12 whose potential is selected to be identical to the substrate potential. The numeral 13 shows a $P^+$ active area located in the $P^-$doped semiconductor layer 12, the numeral 14 shows an $N^-$ doped semiconductor layer, the numeral 15 shows an $N^+$active area, the numeral 16 shows gates, and the numeral 17 shows a VSS line.

In order to fulfill the foregoing object, the foregoing capacitor is required to have a relatively large capacitance. This resultantly requires a large horizontal area on an IC chip. Since improvement in integration is one of the most important requirements for an IC or LSI, the foregoing structure of an IC or LSI is a big drawback which should be removed by all means.

OBJECT AND SUMMARY OF THE INVENTION

Accordingly, an object of this invention is to provide an integrated circuit which does not require an additional horizontal area for arranging a capacitor which is employable to expel higher harmonics contained in a noise originated from a power supply (a power supply noise) toward the outside of the integrated circuit.

The foregoing object can be achieved by any of the following integrated circuits.

An integrated circuit in accordance with the first embodiment of this invention comprising:
  at least one capacitor consisting of a $P^+$ active area originally employable for power supply/GND, a gate insulator layer and a conductive layer produced on at least a part of the $P^+$ active area originally employable for power supply/GND, and
  at least one capacitor consisting of an $N^+$ active area originally employable for power supply/GND, a gate insulator layer and a conductive layer produced on at least a part of the $N^+$ active area originally employable for power supply/GND,
  wherein the capacitors are scheduled to be connected for the purpose to connect a power supply pad and the ground potential for the ultimate purpose to exclude external noise toward outside of the integrated circuit,
  whereby the integrated circuit is appropriate for a semicustom integrated circuit.

As is clear from the above, the only structural change applicable to a semicustom IC or LSI available in the prior art for the purpose of producing an integrated circuit in accordance with the first embodiment of this invention is limited to a structural change applicable to a polycrystalline silicon layer, which is the bottom layer of a semiconductor IC available in the prior art. It is noted that no change is required for the wirings, and that an area which has not been employed so far is positively employed in the first embodiment of this invention.

An integrated circuit in accordance with the second embodiment of this invention comprises:
  three conductive lines arranged close to one another and surrounding a core domain and I/O domains, the three conductive lines forming one MIS capacitor and two fringing capacitors in combination with the peripheral members of the integrated circuit,
  whereby the capacitors are scheduled to be connected for the purpose to exclude external noise toward outside of the integrated circuit, and
  whereby the integrated circuit is appropriate for a semicustom integrated circuit.

As is clear from the above, three independent capacitors are formed by a combination of the middle one of the foregoing three conductive polycrystalline silicon lines, an insulator layer arranged thereunder and a semiconductor layer arranged thereunder, and by combination of the middle one of the foregoing three conductive poly crystalline silicon lines and the end ones of the foregoing three conductive polycrystalline silicon lines, for providing routes for allowing higher harmonics to flow towards the outside of the integrated circuit. It is noted that the domain, which is unemployed in the prior art, is positively employed to enhance the integration.

An integrated circuit in accordance with the third embodiment of this invention comprising:
  at least one conductive line arranged on at least one of the corners of the integrated circuit, the at least one conductive lines forming at least one MIS transistor in combination with the peripheral members of the integrated circuit,
  whereby the capacitors are scheduled to be connected for the purpose to exclude external noise toward outside of the integrated circuit, and
  whereby the integrated circuit is appropriate for a semicustom integrated circuit.

It is noted that areas which are unemployed in the prior art are positively employed to enhance the integration.

An integrated circuit in accordance with the fourth embodiment of this invention comprises:
  a power supply ring line surrounding the core domain of an integrated circuit, the power supply ring line being employed to produce a line for forming at least one MIS capacitor in combination with the other members of the integrated circuit,
  whereby the capacitors are scheduled to be connected for the purpose to exclude external noise toward the outside of the integrated circuit, and whereby the integrated circuit is appropriate for a semicustom integrated circuit.

In this manner, a power supply ring line which surrounds the core domain of an integrated circuit, can be employed to form a capacitor.

An integrated circuit in accordance with the fifth embodiment of this invention comprises:

a wiring arranged in the area where connection pads are originally arranged, the wiring being employed to produce a wiring for forming at least one MIS capacitor in combination with the other members of the integrated circuit, whereby the capacitors are scheduled to be connected for the purpose to exclude external noise toward the outside of the integrated circuit, and whereby the integrated circuit is appropriate for a semicustom integrated circuit.

An integrated circuit in accordance with the sixth embodiment of this invention comprises:

a plurality of unit cells further comprises:
a field effect transistor of one conductivity, an area of the other conductivity, the area being applied the voltage of a power supply, a field effect transistor of the other conductivity, an area of one conductivity, the area being applied the ground potential, and
at least one capacitor further comprises:
the area of the other conductivity,
a dielectric layer produced on the area of the other conductivity, and
a conductive layer produced on the area of the other conductivity.

In the foregoing sixth embodiment of this invention, the gates of the field effect transistors and the electrode of the capacitor can be made of the same material and made via the same gate insulator layer.

BRIEF DESCRIPTION OF THE DRAWINGS

This invention can be readily understood from the following detailed description presented in conjunction with the following drawings, in which.

DETAILED DESCRIPTION OF THE PREFERRED EMBODIMENTS

Referring to drawings, a detailed description will be presented below for integrated circuits in accordance with five independent embodiments of this invention.

First Embodiment

Referring to drawings, an integrated circuit in accordance with the first embodiment of this invention will be described below.

Figure 1:
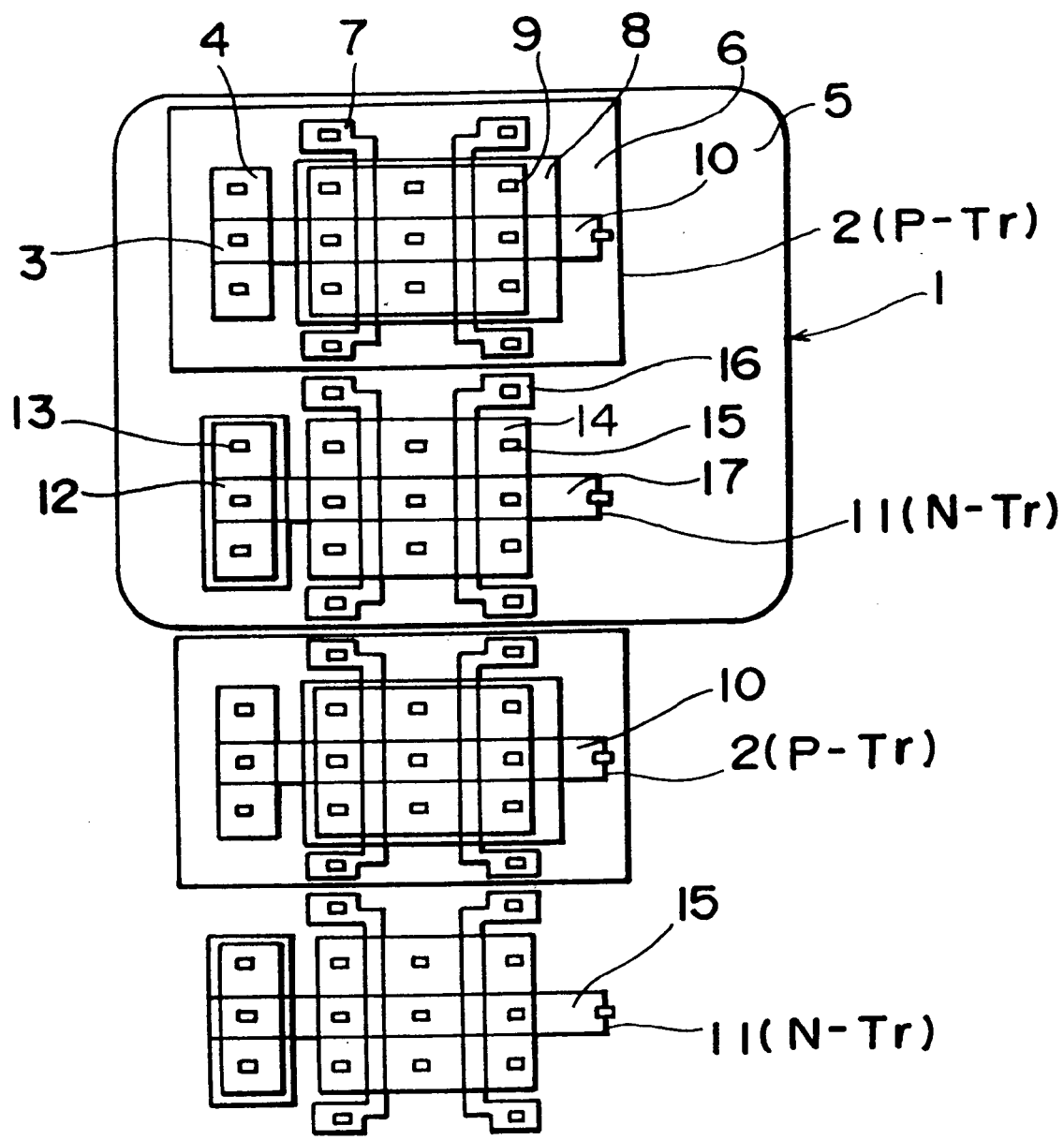
FIG. 1 is a plan view of a unit cell of a semiconductor LSI available in the prior art.
Figure 2:
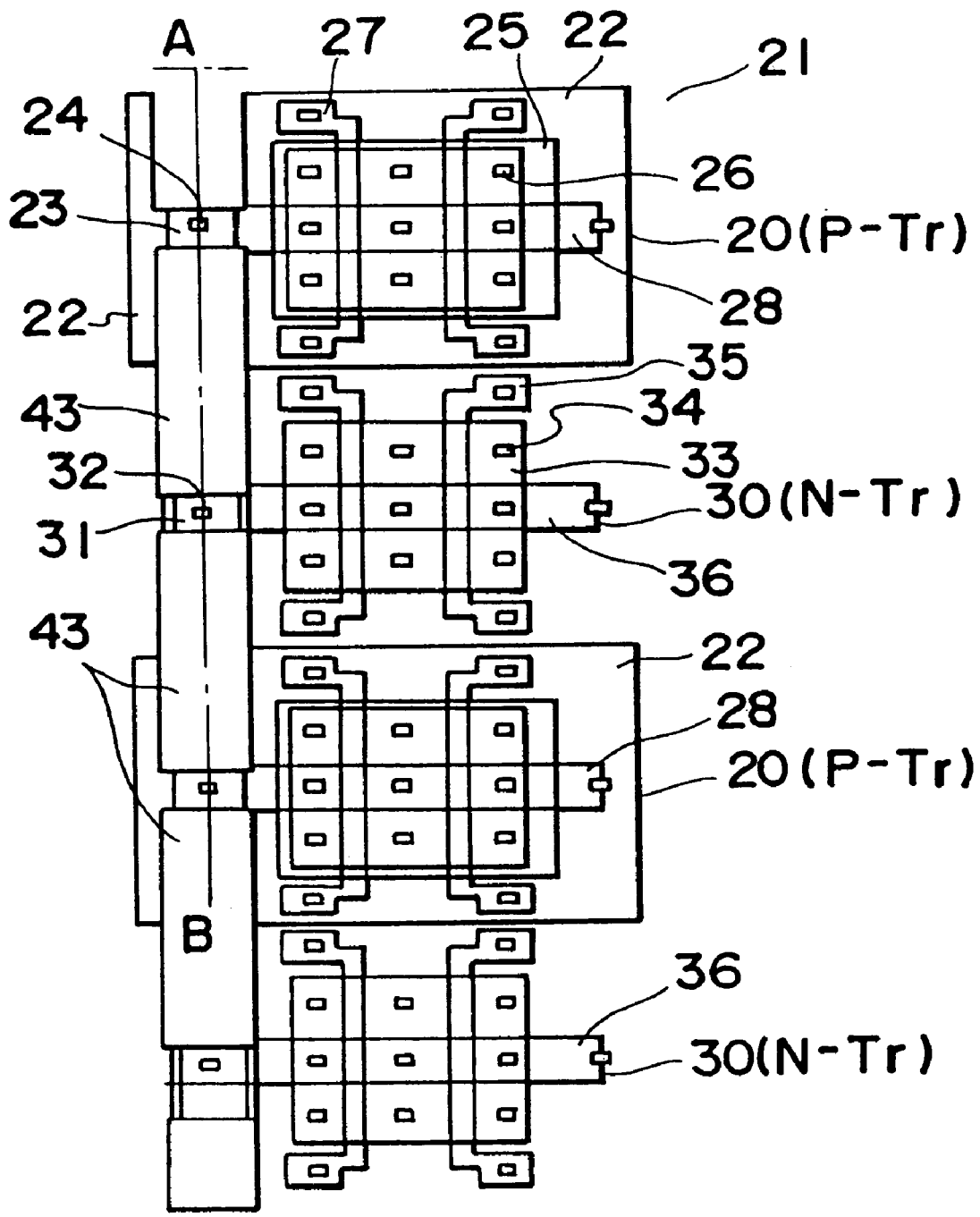
FIG. 2 is a plan view of a unit cell of a semicustom LSI in accordance with the first embodiment of this invention.
Figure 3:
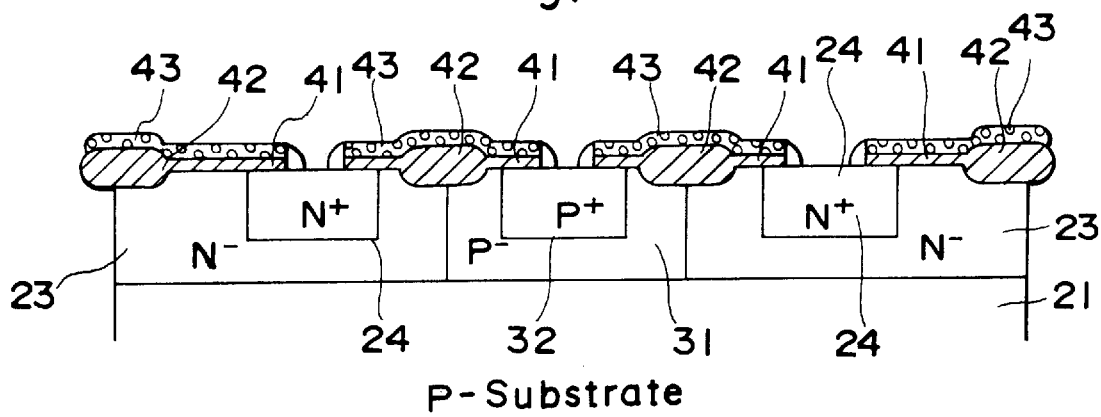
FIG. 3 is a cross section of FIG. 2, along the A-B line.

FIG. 2 is a plan view of a unit cell of a semicustom LSI in accordance with the first embodiment of this invention. A semicustom LSI has a plurality of the unit cells illustrated in FIG. 2, the plurality of the unit cells being arranged in a regular lattice pattern or in a matrix pattern. One of the plural unit cells is illustrated in FIG. 2. FIG. 3 is a cross section of FIG. 2 along the A-B line and FIG. 4 is an equivalent circuit diagram of FIG. 3.

Figure 4:
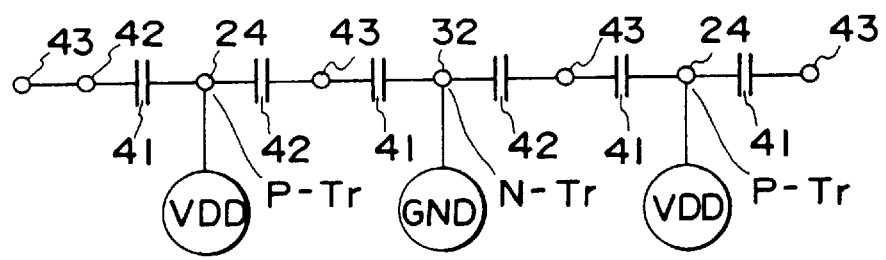
FIG. 4 is an equivalent circuit diagram of FIG. 3.

Referring to FIGS. 2 through 4, a numeral 20 shows a P channel transistor, a numeral 21 shows a P substrate, the numeral 22 shows an N well, the numeral 24 is an $N^+$ active area made in an $N^-$ doped semiconductor layer 23, the numeral 25 shows a $P^-$ doped semiconductor layer, the numeral 26 shows a $P^+$ active area, the numeral 27 shows gates made of conductive poly crystalline silicon and the numeral 28 shows a VDD line.

An N channel transistor 30 has a $P^-$ doped semiconductor layer 31, a $P^+$ active area 32 produced in the $P^-$doped semiconductor layer, an $N^-$ doped semiconductor layer 33, an $N^+$ active area produced in the $N^-$doped semiconductor area 33, an $N^+$ active area 34, a gate 35 made of conductive polycrystalline silicon and a VSS line 36.

Polycrystalline silicon layers 43 are produced to cover all the active areas 24 and 32 which are exclusively employed for power supply/GND, to form capacitors each of which consists of the polycrystalline silicon layers 43, the gate insulator 41 and the active area 24 or 32. The polycrystalline silicon layers 43 made of conductive polycrystalline silicon are produced in a step for producing the gates 27 or simultaneously with the gates 27. In other words, the polycrystalline silicon layers 43 are produced on an active area 24 or 32, thereby MIS capacitors described above are produced. In FIG. 3, the numeral 42 shows a field insulator layer.

As described above, capacitors are formed by the $P^+$ active area 32, a gate insulator layer 41 and the polycrystalline silicon layer 43 and by the $N^+$ active area 24, a gate insulator layer 41 and the polycrystalline silicon layer 43. These capacitors are connected in series by the polycrystalline silicon layer 43 produced on the field insulator layer 42, as shown by an equivalent circuit diagram illustrated in FIG. 4.

Since the capacitors are formed by combination of the $P^+$ active area 32, a gate insulator layer 41 and the polycrystalline silicon layer 43 and of the $N^+$ active area 24, a gate insulator layer 41 and the polycrystalline silicon layer 43, no change is required for layer configuration of a semiconductor LSI available in the prior art, to produce a semicustom LSI in accordance with the first embodiment of this invention. Further, since an area which was unemployed in the prior art is positively employed in this embodiment of this invention, the magnitude of integration is improved. In addition, since the dielectric layer 41 of the capacitor is a thin silicon dioxide layer produced by oxidation of silicon in the step for producing the gate insulator layer 41, the capacity of the capacitor is large.

Second Embodiment

Referring to drawings, an integrated circuit in accordance with the second embodiment of this invention will be described below.

Figure 5:
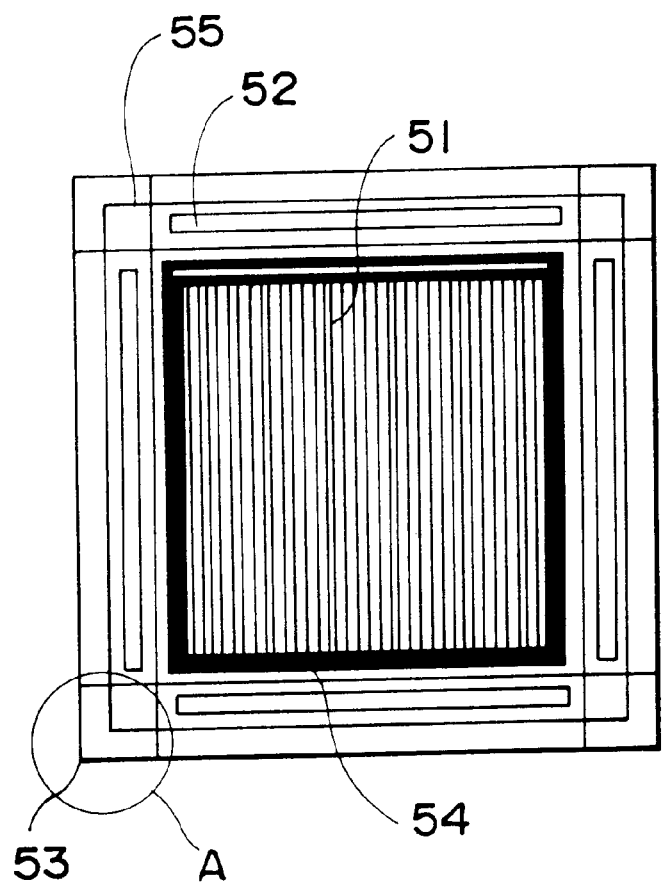
FIG. 5 is a plan view of a unit cell of a semicustom LSI in accordance with the second embodiment of this invention.
Figure 6:
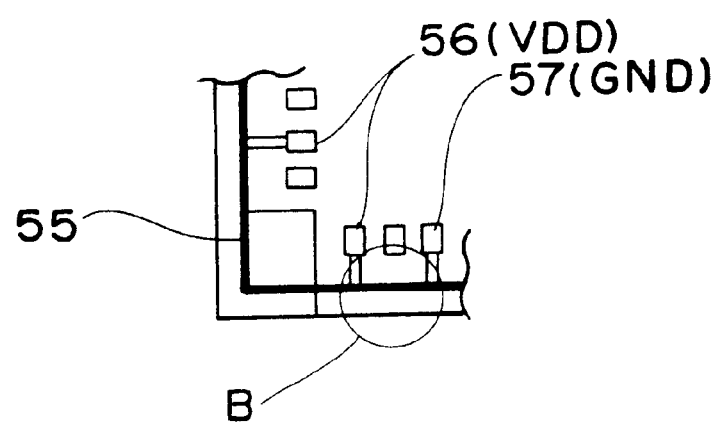
FIG. 6 is an enlarged plan view of the corner (Corner A) of a semicustom LSI in accordance with the second embodiment of this invention.
Figure 7:
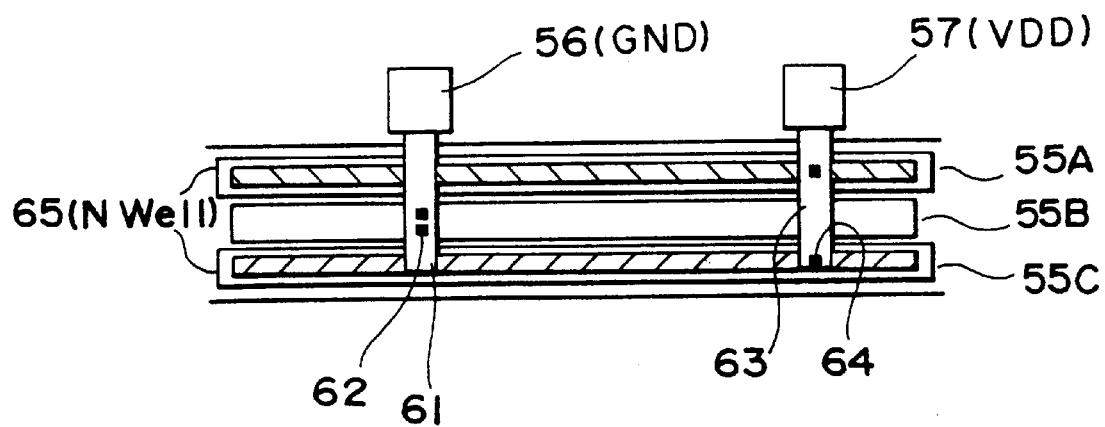
FIG. 7 is an enlarged plan view of edge B of a semicustom LSI in accordance with the second embodiment of this invention, the edge B being shown in FIG. 6.

FIG. 5 is the plan view of a semicustom LSI in accordance with the second embodiment of this invention, FIG. 6 is an enlarged plan view of the corner (Corner A) of a semicustom LSI in accordance with the second embodiment of this invention and FIG. 7 is an enlarged plan view of edge B of a semicustom LSI in accordance with the second embodiment of this invention, the edge B being shown in FIG. 6.

Referring to FIG. 5, a semicustom LSI in accordance with the second embodiment of this invention consists of a core domain 51, I/O domains 52, corner (Corner A) 53, a power supply ring 54 which surrounds the core domain 51 and three lines 55 each of which is arranged close to one another and which are made of polycrystalline silicon.

Referring to FIG. 6, the three lines 55 arranged close to one another and which are made of polycrystalline silicon are produced in an area unemployed in the prior art. It is noted that connection pads 56 to be connected with VDD and connection pads 57 to be connected with GND are utilized for producing the three lines 55. It is further noted that the three lines 55 are arranged to minimize the space therebetween. The three lines 55 surround the core domain 51 and the I/O domains 52.

Referring to FIG. 7, the three polycrystalline silicon lines arranged close to one another consist of a first polycrystalline silicon line 55A, a second polycrystalline silicon line 55B and a third polycrystalline silicon line 55C. The numerals 61 and 63 show respectively a line drawn from the pad 56(GND) and the pad 57(VDD). The numerals 62 and 63 show contacts. The numeral 65 shows an N well.

A layout system is employed to produce the foregoing circuit structure. VDD/GND cells are arranged in a wiring step. After the VDD cell is arranged by an automatic process, the line 61 drawn from the pad 56(GND) is connected with the second polycrystalline silicon line 55B by the contact 62. After the GND cell is arranged by an automatic process, the line 63 drawn from the pad 57(VDD) is connected with the first polycrystalline silicon line 55A and the third polycrystalline silicon line 55C by the contact 64. The second polycrystalline silicon line 55B is arranged on an N$^+$ active area, and the first polycrystalline silicon line 55A and the third polycrystalline silicon line 55C are arranged on a P$^+$ active area. Further, an N well electrically separates the area from the substrate.

The foregoing layer arrangement is effective to produce a capacitor. In other words, a MIS capacitor is produced by the second polycrystalline silicon line 55B and the lower layers, and fringing capacitors are produced by a combination of the second polycrystalline silicon line 55B and the first polycrystalline silicon line 55A and by a combination of the second polycrystalline silicon line 55B and the third polycrystalline silicon line 55C.

As was described above, an integrated circuit in accordance with the second embodiment of this invention is provided with three polycrystalline silicon lines 55A, 55B and 55C which are produced surrounding the core domain and the I/O domains. This resultantly produces a large amount of MIS capacity and fringing capacity, which can be employed to expel the power supply noise toward the outside of the integrated circuit. Since the area on which the foregoing three polycrystalline silicon lines are produced is an area unemployed along the edges of the integrated circuit available in the prior art, the integrated circuit in accordance with the second embodiment of this invention turns out to improve the integration for the integrated circuit.

Third Embodiment

Referring to drawings, an integrated circuit in accordance with the third embodiment of this invention will be described below.

Figure 8:
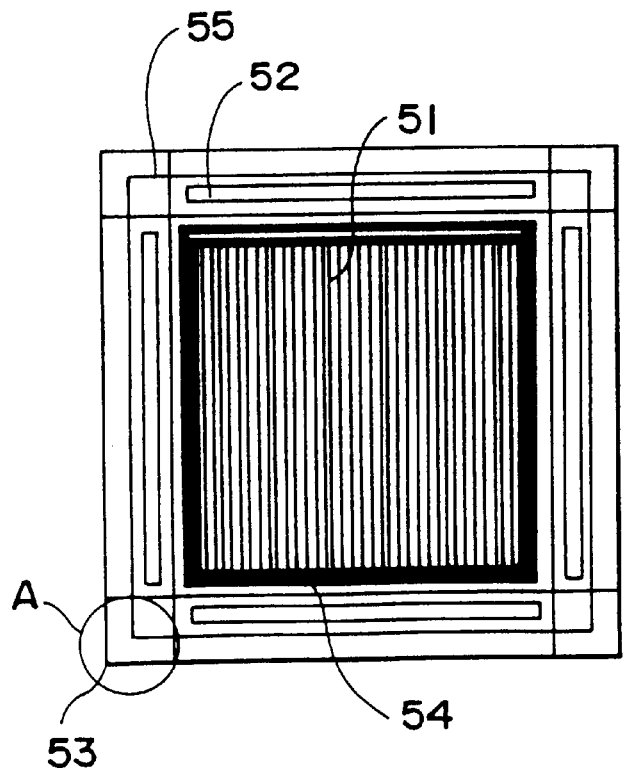
FIG. 8 is a plan view of a unit cell of a semicustom LSI in accordance with the third embodiment of this invention.
Figure 9:
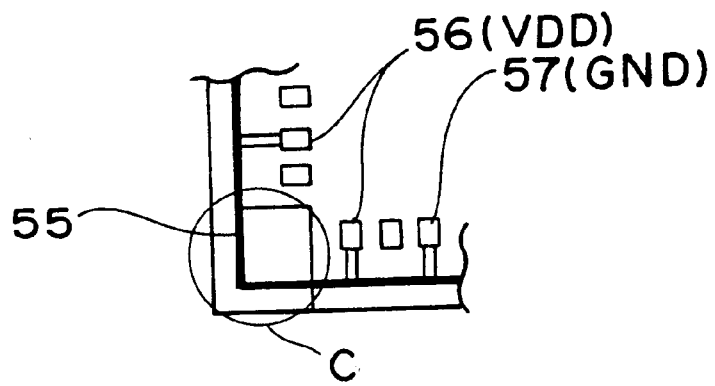
FIG. 9 is an enlarged plan view of the corner (Corner E) of a semicustom LSI in accordance with the third embodiment of this invention.
Figure 10:
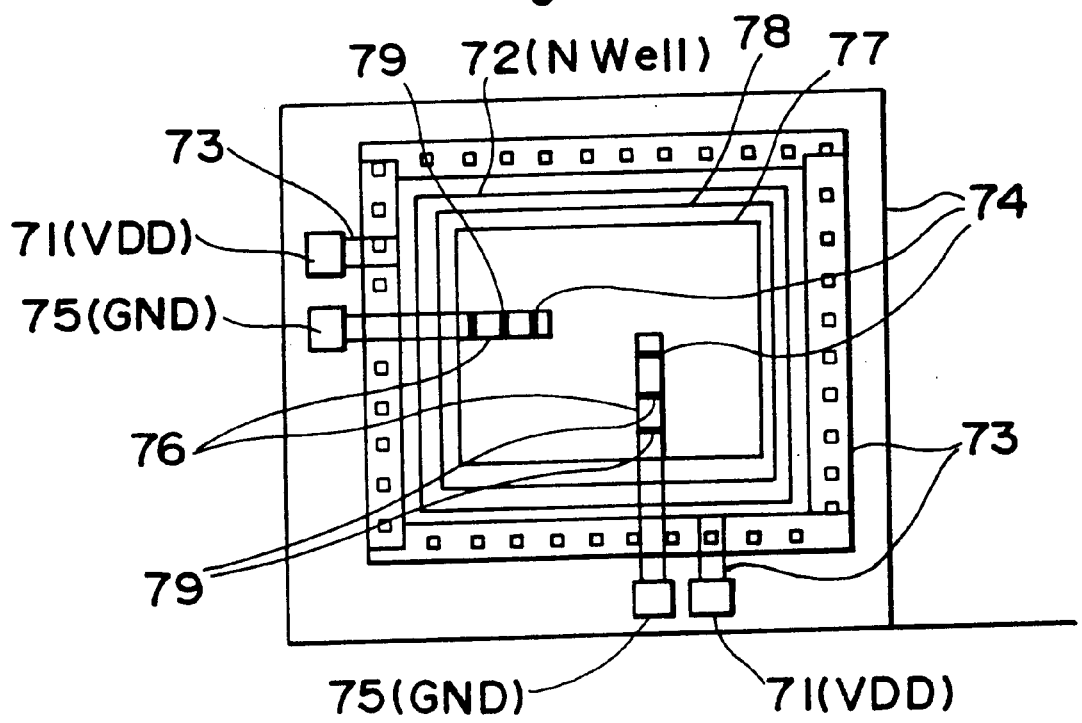
FIG. 10 is a more enlarged plan view of the corner (Corner C) of a unit cell of a semicustom LSI in accordance with the third embodiment of this invention.

FIG. 8 is a plan view of a semicustom LSI in accordance with the third embodiment of this invention, FIG. 9 is an enlarged plan view of the corner (Corner E) of a semicustom LSI in accordance with the third embodiment of this invention and FIG. 10 is a more enlarged plan view of the corner (Corner C) of a semicustom LSI in accordance with the third embodiment of this invention. Since the overall structure of and the specific structure of the corner (Corner E) of the semicustom LSI in accordance with the third embodiment of this invention are identical to those of the semicustom LSI in accordance with the second embodiment of this invention, all the members illustrated in FIGS. 8 through 10 are allotted numerals identical to those of the corresponding ones of the second embodiment. Thus, eliminated is a detailed description for the general matters of the semicustom LSI in accordance with the third embodiment of this invention.

Referring to FIG. 10, a VDD pad 71 which is a fixed pad is connected with a P$^+$ active area 78 by contacts 74 at locations where a wiring 73 surrounds an N well 72. Upper lines 76 are drawn from a GND pad 75 which is a fixed pad and are connected with a polycrystalline silicon layer 77 by contacts 74 and by second through holes (VIA2) 79. The polycrystalline silicon layer 77 is produced on a P$^+$ active area 78, and is separated from a substrate by an N well 72.

As was described above, an integrated circuit in accordance with the third embodiment of this invention is provided by a polycrystalline silicon line produced at the corners of an integrated circuit. The corners, which were unemployed in the prior art, are positively utilized to produce capacitors which are employed to exclude external noises from the integrated circuit.

Fourth Embodiment

Referring to drawings, an integrated circuit in accordance with the fourth embodiment of this invention will be described below.

Figure 11:
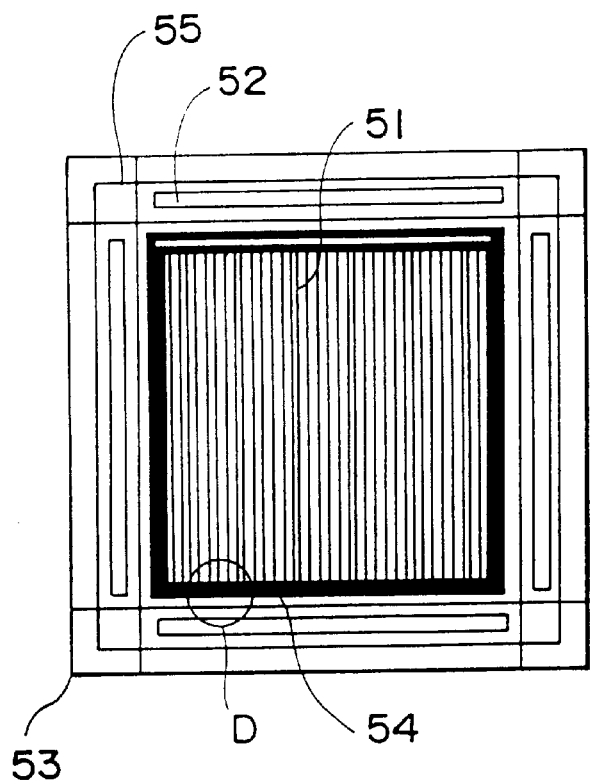
FIG. 11 is a plan view of a unit cell of a semicustom LSI in accordance with the fourth embodiment of this invention.
Figure 12:
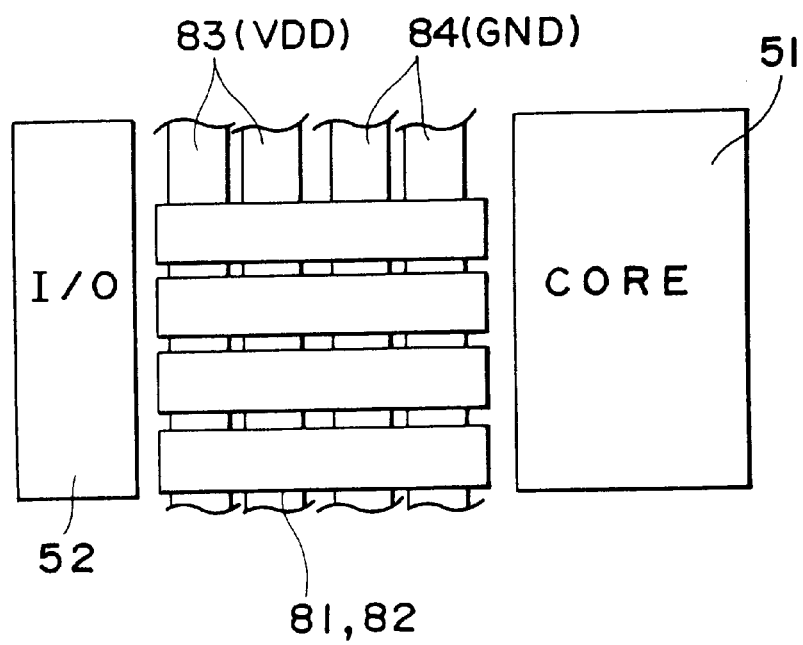
FIG. 12 is an enlarged plan view of Area D (Power supply ring) of a unit cell of a semicustom LSI in accordance with the fourth embodiment of this invention.

FIG. 11 is a plan view of a semicustom LSI in accordance with the fourth embodiment of this invention, and FIG. 12 is an enlarged plan view of the edge D (power supply ring line) of a semicustom LSI in accordance with the fourth embodiment of this invention.

Since the structure of the semiconductor LSI in accordance with the fourth embodiment of this invention is identical to that of the second embodiment of this invention, all the members illustrated in FIGS. 11 and 12 are allotted numerals identical to those of the corresponding ones of the second embodiment of this invention. Thus, eliminated is a detailed description for the general matters of a semicustom LSI in accordance with the fourth embodiment of this invention.

Referring to FIG. 12, processes employed for the second and third embodiments are employed to produce an active layer 81 under the area of the power supply ring line 54. The active layer 81 is covered by a polycrystalline silicon layer 82, to form a capacitor thereby. The numerals 83 and 84 show respectively VDD lines and GND lines.

As was described above, a power supply ring line 54, which surrounds the core domain 51 of an integrated circuit, can be employed to arrange a polycrystalline silicon line 55 to form a capacitor.

In a similar manner as is in the second and third embodiments, a polycrystalline silicon layer can be produced on the I/O domains 52 which are produced on the active layer. This layer configuration is also effective to produce a capacitor.

Fifth Embodiment

Referring to drawings, an integrated circuit in accordance with the fifth embodiment of this invention will be described below.

Figure 13:
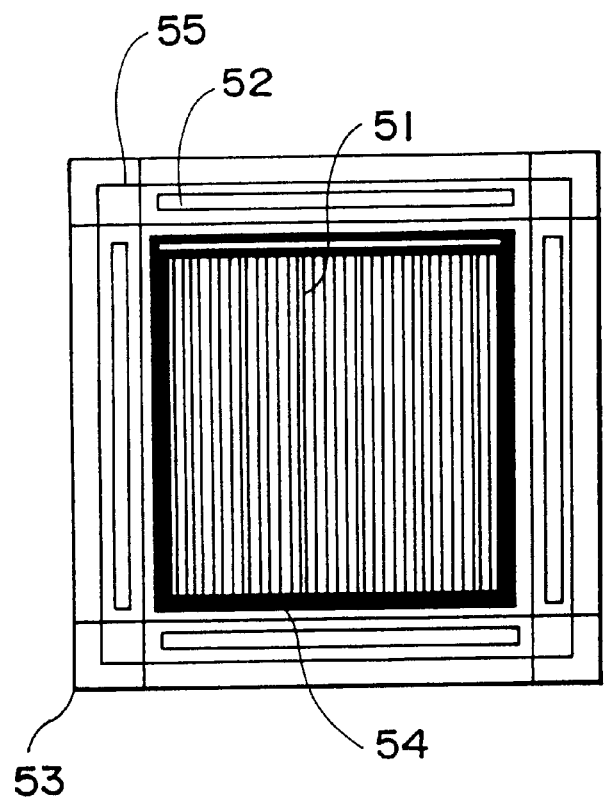
FIG. 13 is a plan view of a unit cell of a semicustom LSI in accordance with the fifth embodiment of this invention.
Figure 14:
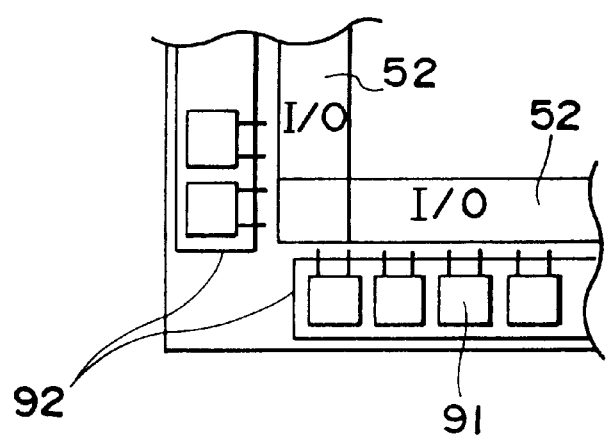
FIG. 14 is an enlarged plan view of the corner of a unit cell of a semicustom LSI in accordance with the fifth embodiment of this invention.

FIG. 13 is a plan view of a semicustom LSI in accordance with the fifth embodiment of this invention and FIG. 14 is an enlarged plan view of the corner of a semicustom LSI in accordance with the fifth embodiment of this invention.

Since the overall structure of the semicustom LSI in accordance with the fifth embodiment of this invention is identical to that of the semicustom LSI in accordance with the second embodiment of the invention, all the members illustrated in FIGS. 13 and 14 are allotted numerals identical to those of the corresponding ones of the second embodiment. Thus, eliminated is a detailed description for the general matters of the semicustom LSI in accordance with the fifth embodiment of this invention.

Referring to FIG. 14, polycrystalline silicon layers and active regions 92 are arranged in the area where pads 91 are arranged. In this manner, a capacitor can be produced.

As was described above, an integrated circuit in accordance with the fifth embodiment of this invention positively employs the area unemployed in the prior art.

The foregoing description has clarified that an integrated circuit which does not require an additional horizontal area for arranging a capacitor, which is employable to expel higher harmonics contained in a power supply noise toward the outside of the integrated circuit, has successfully been provided by this invention, resultantly enabling the integrated circuit to be appropriately employed for a semicustom LSI. It is particularly emphasized that this invention positively employs the surface area of an integrated circuit which area is unemployed in the prior art, specifically for the purpose to produce a capacitor for the ultimate purpose to exclude external noise, particularly noise originated from a power supply.

Although this invention has been described with reference to specific embodiments, this description is not meant to be construed in a limiting sense. Various modifications of the disclosed embodiments, as well as other embodiments of this invention which are based on the concept that the area of an integrated circuit unemployed in the prior art is positively employed for producing a capacitor which is employed to exclude external noises particularly noises originated from a power supply, will be apparent to persons skilled in the art upon reference to the description of this invention. It is therefore contemplated that the appended claims will cover any such modifications or as fall within the true scope of this invention.

What is claimed is:

1. An integrated circuit having a plurality of unit cells disposed adjacent each other, each of said unit cells comprising:

a first transistor of a first conductivity;

a first area of a second conductivity;

a second transistor of the second conductivity;

a second area of the first conductivity;

a first power supply line supplying a first voltage to the first transistor and the first area;

a second power supply line supplying a second voltage to the second transistor and the second area; and a first conductive line extended over the first and second areas electrically separated from the first and second voltages.

2. An integrated circuit according to claim 1, wherein gates of said first and second transistors and the first conductive line are made of a same material and made over a same insulator layer.

3. An integrated circuit according to claim 1, each of said unit cells further comprising a second conductive line extended over the second area and extended over a first area of an adjacent unit cell.

4. An integrated circuit according to claim 3, each of said unit cells further comprising a third conductive line extended over the first area and extended over a second area of another adjacent unit cell.

5. An integrated circuit according to claim 1, each unit cell further comprising an insulator layer between the first conductive line and the first area such that a first capacitor is formed by the first conductive line, the insulator layer, and the first area.

6. An integrated circuit according to claim 5, each of said unit cells further comprising an insulator layer between the conductive line and the second area such that a second capacitor is formed by the conductive line, the insulator layer, and the second area.

7. An integrated circuit having a plurality of unit cells adjacently formed in a semiconductor substrate of a first conductivity, each of said unit cells comprising:

a well of a second conductivity formed in the substrate;

a first transistor of the second conductivity formed in the semiconductor substrate;

a first region of the first conductivity formed in the semiconductor substrate, said first region being supplied a first voltage;

a second transistor of the first conductivity formed in the well;

a second region of the second conductivity formed in the well, said second region being supplied a second voltage; and a conductive line extended over the first and second regions electrically separated from the first and second voltages.

8. An integrated circuit according to claim 7, wherein:

the substrate, said first region, said second region, and the well each further comprise an associated impurity concentration;

said associated impurity concentration of said first region is relatively higher than said associated impurity concentration of the substrate; and said associated impurity concentration of said second region is relatively higher than said associated impurity concentration of the well.

9. An integrated circuit according to claim 7, wherein:

the substrate and said first region each further comprise an associated impurity concentration; and said associated impurity concentration of said first region is relatively higher than said associated impurity concentration of the substrate.

10. An integrated circuit according to claim 7, wherein:

said second region and the well each further comprise an associated impurity concentration; and said associated impurity concentration of said second region is relatively higher than said associated impurity concentration of the well.

\* \* \* \* \*

UNITED STATES PATENT AND TRADEMARK OFFICE
CERTIFICATE OF CORRECTION

PATENT NO. : 6,121,645
DATED : September 19, 2000
INVENTOR(S) : Hirohisa Masuda, et al.

It is certified that error appears in the above-identified patent and that said Letters Patent is hereby corrected as shown below:

On the title page: Please insert the Assignee information as follows:

--[73] OKI ELECTRIC INDUSTRY CO., LTD.
    Japan--

Signed and Sealed this

Eighth Day of May, 2001

*Attest:*

NICHOLAS P. GODICI

*Attesting Officer*    *Acting Director of the United States Patent and Trademark Office*